(12) United States Patent
Dennard et al.

(10) Patent No.: US 8,877,606 B2
(45) Date of Patent: Nov. 4, 2014

(54) LOW COST FABRICATION OF DOUBLE BOX BACK GATE SILICON-ON-INSULATOR WAFERS WITH SUBSEQUENT SELF ALIGNED SHALLOW TRENCH ISOLATION

(75) Inventors: Robert H. Dennard, Croton-on-Hudson, NY (US); David R. Greenberg, White Plains, NY (US); Amlan Majumdar, White Plains, NY (US); Leathen Shi, Yorktown Heights, NY (US); Jeng-Bang Yau, Ossining, NY (US)

(73) Assignee: International Business Machines Corporation, Armonk, NY (US)

( * ) Notice: Subject to any disclaimer, the term of this patent is extended or adjusted under 35 U.S.C. 154(b) by 178 days.

(21) Appl. No.: 13/350,889

(22) Filed: Jan. 16, 2012

(65) Prior Publication Data

US 2012/0112309 A1 May 10, 2012

Related U.S. Application Data

(62) Division of application No. 12/352,077, filed on Jan. 12, 2009, now abandoned.

(51) Int. Cl.
*H01L 21/76* (2006.01)
*H01L 27/12* (2006.01)
*H01L 21/762* (2006.01)
*H01L 21/84* (2006.01)

(52) U.S. Cl.
CPC ............ *H01L 21/84* (2013.01); *H01L 27/1203* (2013.01); *H01L 21/76275* (2013.01); *H01L 21/76283* (2013.01); *H01L 21/76254* (2013.01)
USPC ........... 438/427; 438/283; 438/296; 257/347; 257/E21.564; 257/E27.112

(58) Field of Classification Search
CPC ............ H01L 27/1203; H01L 27/1207; H01L 29/78648; H01L 21/762
USPC ................ 438/359, 424, 458, 283, 296, 427; 257/347, E21.564, E27.112, E29.273
See application file for complete search history.

(56) References Cited

U.S. PATENT DOCUMENTS 5,374,564 A 12/1994 Bruel
5,882,987 A 3/1999 Srikrishnan
(Continued)

FOREIGN PATENT DOCUMENTS

WO 9520824 A1 3/1995
WO 2006001915 A2 1/2006
(Continued)

OTHER PUBLICATIONS

Avci, "Back-gate MOSFET for power-adaptive applications," Cornell University Ph.D. thesis, vol. 66014B of Dissertations Abstracts International, ISBN:0-542-10276-5; 2005, p. 2218.
(Continued)

*Primary Examiner* — Jesse Y Miyoshi
(74) *Attorney, Agent, or Firm* — Cantor Colburn LLP; Vazken Alexanian

(57) ABSTRACT

A semiconductor substrate structure for manufacturing integrated circuit devices includes a bulk substrate; a lower insulating layer formed on the bulk substrate, the lower insulating layer formed from a pair of separate insulation layers having a bonding interface therebetween; an electrically conductive layer formed on the lower insulating layer; an insulator with etch stop characteristics formed on the electrically conductive layer; an upper insulating layer formed on the etch stop layer; and a semiconductor layer formed on the upper insulating layer. A scheme of subsequently building a dual-depth shallow trench isolation with the deeper STI in the back gate layer self-aligned to the shallower STI in the active region in such a semiconductor substrate is also disclosed.

6 Claims, 19 Drawing Sheets

(56) References Cited

U.S. PATENT DOCUMENTS

| | | | |
|---|---|---|---|
| 6,057,212 A * | 5/2000 | Chan et al. | 438/455 |
| 6,083,797 A | 7/2000 | Wong et al. | |
| 6,093,623 A | 7/2000 | Forbes | |
| 6,162,741 A * | 12/2000 | Akasaka et al. | 438/773 |
| 6,228,691 B1 | 5/2001 | Doyle | |
| 6,246,094 B1 | 6/2001 | Wong et al. | |
| 6,414,361 B2 | 7/2002 | Wong et al. | |
| 6,566,158 B2 | 5/2003 | Eriksen et al. | |
| 6,576,957 B2 * | 6/2003 | Houston | 257/347 |
| 6,580,128 B2 | 6/2003 | Ohkubo | |
| 6,849,518 B2 * | 2/2005 | Parat et al. | 438/424 |
| 7,008,857 B2 | 3/2006 | Ghyselen et al. | |
| 7,018,873 B2 | 3/2006 | Dennard et al. | |
| 7,102,166 B1 | 9/2006 | Bryant et al. | |
| 7,132,339 B2 | 11/2006 | Bryant et al. | |
| 7,235,812 B2 | 6/2007 | Chu et al. | |
| 7,323,370 B2 | 1/2008 | Furukawa | |
| 7,410,904 B2 | 8/2008 | Stasiak et al. | |
| 7,439,110 B2 | 10/2008 | Cheng et al. | |
| 7,453,123 B2 | 11/2008 | Dokumaci et al. | |
| 7,682,941 B2 | 3/2010 | Anderson et al. | |
| 7,732,287 B2 * | 6/2010 | Fechner et al. | 438/296 |
| 7,898,003 B2 | 3/2011 | Cheng et al. | |
| 8,016,941 B2 | 9/2011 | Hierlemann et al. | |
| 8,169,007 B2 | 5/2012 | Anderson et al. | |
| 8,193,032 B2 | 6/2012 | Chen et al. | |
| 8,193,616 B2 | 6/2012 | Hamaguchi et al. | |
| 2003/0186073 A1 | 10/2003 | Fitzgerald | |
| 2005/0067055 A1 | 3/2005 | Choe et al. | |
| 2005/0087804 A1 * | 4/2005 | Furukawa | 257/347 |
| 2005/0181612 A1 | 8/2005 | Brask et al. | |
| 2006/0057836 A1 | 3/2006 | Nagarajan et al. | |
| 2006/0172505 A1 | 8/2006 | Koester et al. | |
| 2006/0231873 A1 * | 10/2006 | Anderson et al. | 257/347 |
| 2006/0231893 A1 | 10/2006 | Bernstein et al. | |
| 2006/0284251 A1 | 12/2006 | Hsu et al. | |
| 2007/0034950 A1 | 2/2007 | Park et al. | |
| 2007/0040218 A1 | 2/2007 | Haensch et al. | |
| 2007/0075317 A1 * | 4/2007 | Kato et al. | 257/74 |
| 2007/0122998 A1 | 5/2007 | Droes et al. | |
| 2007/0138533 A1 | 6/2007 | Dennard et al. | |
| 2007/0281441 A1 | 12/2007 | Dantz et al. | |
| 2008/0001183 A1 | 1/2008 | Kapoor | |
| 2008/0036000 A1 | 2/2008 | Anderson et al. | |
| 2008/0185644 A1 | 8/2008 | Anderson et al. | |
| 2009/0057746 A1 | 3/2009 | Sugll et al. | |
| 2009/0127591 A1 | 5/2009 | Moriwaka | |
| 2010/0176482 A1 | 7/2010 | Dennard et al. | |
| 2011/0284961 A1 | 11/2011 | Botula et al. | |

FOREIGN PATENT DOCUMENTS

| | | |
|---|---|---|
| WO | 2007030368 A2 | 3/2007 |
| WO | 2008148882 A2 | 12/2008 |
| WO | 2009128776 A1 | 10/2009 |
| WO | 2010080292 A1 | 7/2010 |

OTHER PUBLICATIONS

J. B. Yau et al.; "FDSOI CMOS with Dual Backgate Control for Performance and Power Modulation;" IEEE; 2009; pp. 84-85.

International Search Report; International Application No. PCT/EP2010/066715; International Filing Date: Nov. 3, 2010; Date of Mailing: Feb. 11, 2011.

International Search Report; International Application No. PCT/US 09/67102; International Filing Date: Dec. 8, 2009; Date of mailing: Feb. 25, 2010; 3 pages.

S. Bedell et al.; "Mobility Scaling in Short-Channel Length Strained Ge-on-Insulator P-MOSFETs;" IEEE Electron Device Letters, vol. 29, No. 7, Jul. 2008; pp. 811-813.

International Search Report-Written Opinion ; International Application No. PCT/EP2010/066715; International Filing Date: Nov. 3, 2010; Date of Mailing: Feb. 11, 2011.

T. Tezuka et al.; "Strained SOI/SGOI dual-channel CMOS technology based on the Ge condensation technique;" Semiconductor Science and Technology 22; 2007; pp. S93-S98.

R. Tsuchiya et al.; "Controllable Inverter Delay and Suppressing Vth Fluctuation Technology in Silicon on Thin BOX Featuring Dual Back-Gate Bias Architecture;" IEEE; 2007; pp. 475-478.

International Written Opinion; International Application No. PCT/US 09/67102; Date of mailing: Feb. 25, 2010; 7 pages.

U.S. Appl. No. 12/613,574; Non-Final Office Action; filed Nov. 6, 2009; Date Mailed: Aug. 17, 2012; pp. 1-24.

Deutsches Patent-und Markenamt, DE Office Action; 11 2010004307.8, Sep. 20, 2012, pp. 1-6.

* cited by examiner

LOW COST FABRICATION OF DOUBLE BOX BACK GATE SILICON-ON-INSULATOR WAFERS WITH SUBSEQUENT SELF ALIGNED SHALLOW TRENCH ISOLATION

CROSS-REFERENCE TO RELATED APPLICATION

This application is a divisional of U.S. patent application Ser. No. 12/352,077, filed Jan. 12, 2009, the disclosure of which is incorporated by reference herein in its entirety.

BACKGROUND

The present invention relates generally to semiconductor device manufacturing techniques and, more particularly, to low cost fabrication of double buried oxide (BOX), back gate (DBBG) silicon-on-insulator (SOI) wafers with subsequent dual-depth self-aligned shallow trench isolation (STI).

In SOI technology, a thin silicon layer is formed over an insulating layer, such as silicon oxide, which in turn is formed over a bulk substrate. This insulating layer is often referred to as a buried oxide (BOX) layer or simply a BOX. For a single BOX SOI wafer, the thin silicon layer is divided into active regions by shallow trench isolation (STI), which intersects the BOX, providing a total isolation for the active regions. Sources and drains of field effect transistors (FETs) are formed, for example, by ion implantation of N-type and/or P-type dopant material into the thin silicon layer with a channel region between the source and drain using the gate pattern to self-define the channel region. Prior to the formation of sources and drains, gates are formed on top of the channel region, for example, by deposition of a gate dielectric and conductor on the top surface of the thin silicon, followed by photolithographic patterning, and etching. Back gates can also be formed under the active region on a single BOX SOI wafer using the BOX layer as the back-gate dielectric, and can be defined by either P+ or N+ implantation. Transistors with back gates typically use relatively thin silicon and BOX layers to enable fully depleted device operation with a threshold voltage which is responsive to the back gate. Such FETs built in thin SOI technology with back gates have significant advantages such as, for example, reduced short channel effects, less threshold variability due to body doping fluctuations, and ability to use the back gate voltage to adjust the threshold.

In addition to single BOX SOI substrates, double BOX substrates may also be used in forming transistor devices having dual gate electrodes formed both above and below the transistor channel region. The conductive gate material formed below the device channel, also referred to as a back gate, is separated from the SOI active layer by a first BOX, and is separated from the substrate by a second BOX.

Typically, in order to manufacture such a double BOX wafer having an upper BOX and a lower BOX therein, at least one preformed SOI wafer is used as a starting substrate. However, the cost of preformed SOI wafers is usually several times that of device-quality bulk silicon wafers. Thus, purchasing SOI wafers as a starting substrate adds to the cost of forming a double BOX SOI wafer. Moreover, conventional double BOX back gate (DBBG) SOI wafers formed without providing well defined n-well and p-well isolation can result in unacceptably large junction and/or current leakage during back gate device operations. Accordingly, it would be desirable to be able to fabricate a substrate such as a double BOX back gate (DBBG) SOI wafer, with or without additional structures located therein, at a lower cost with respect to conventional processes and in a manner that also provides better isolation to alleviate the current leakage problem.

SUMMARY

In an exemplary embodiment, a method of forming a semiconductor wafer structure for integrated circuit devices includes forming a first substrate portion having a first bulk substrate, a sacrificial layer formed on the first bulk substrate, a semiconductor layer formed on the sacrificial layer, a first insulating layer formed on the semiconductor layer, an electrically conductive layer formed over the first insulating layer, and a second insulating layer, suitable for bonding to another insulating layer, formed on the electrically conductive layer; forming a second substrate portion having a second bulk substrate and a third insulating layer formed on the second bulk substrate; bonding the second substrate portion to the first substrate portion so as to define a bonding interface between the second and third insulating layers; separating the resulting bonded structure at a location within the first bulk substrate or the sacrificial layer and removing any remaining portion of the first bulk substrate; and removing any remaining portion of the sacrificial layer so as to define a double buried insulator back gate semiconductor-on-insulator wafer structure, wherein the first insulating layer comprises an upper insulating layer, the bonded second and third insulating layers together comprise a lower insulating layer, the semiconductor layer comprises a semiconductor-on-insulator layer, the electrically conductive layer comprises a back gate layer, and the second bulk substrate comprises a bulk substrate of the double buried insulator back gate semiconductor-on-insulator wafer structure.

In another embodiment, a method of forming a double buried insulator back gate semiconductor-on-insulator wafer structure for integrated circuit devices includes forming a first substrate portion having a first bulk substrate, a sacrificial layer formed on the first bulk substrate, a semiconductor layer formed on the sacrificial layer, a first insulating layer formed on the semiconductor layer, an electrically conductive layer formed over the first insulating layer, and a second insulating layer, suitable for bonding to another insulating layer, formed on the electrically conductive layer; forming a second substrate portion having a second bulk substrate and a third insulating layer formed on the second bulk substrate; implanting a hydrogen species through the second insulating layer, the electrically conductive layer, the first insulating layer and the semiconductor layer, stopping within or beyond the sacrificial layer; bonding the second substrate portion to the first substrate portion so as to define a bonding interface between the second and third insulating layers; performing an annealing procedure so as to create a front of connecting voids corresponding to a location of the hydrogen species; separating the bonded structure along the void front; and removing any remaining part of the first bulk substrate and the sacrificial layer on the semiconductor layer so as to define the double buried insulator back gate semiconductor-on-insulator wafer structure, wherein the first insulating layer comprises an upper insulating layer, the bonded second and third insulating layers together comprise a lower insulating layer, the semiconductor layer comprises a semiconductor-on-insulator layer, the electrically conductive layer comprises a back gate layer, and the second bulk substrate comprises a bulk substrate of the double buried insulator back gate semiconductor-on-insulator wafer structure.

In another embodiment, a method of forming a double buried oxide (BOX), back gate (DBBG) silicon-on-insulator (SOI) wafer structure for integrated circuit devices includes forming a first substrate portion having a first bulk silicon substrate, a silicon germanium (SiGe) layer epitaxially grown on the first bulk silicon substrate, a silicon layer epitaxially grown on the SiGe layer, a first oxide layer thermally grown or deposited on the silicon layer, an etch stop layer deposited on the first oxide layer, an electrically conductive back gate layer formed on the etch stop layer, and a second oxide layer thermally grown or deposited on the back gate layer; forming a second substrate portion having a second bulk silicon substrate and a third oxide layer thermally grown or deposited on the second bulk substrate; implanting a hydrogen species through the second oxide layer, the electrically conductive back gate layer, the etch stop layer, the first oxide layer and the silicon layer, stopping within or beyond the SiGe layer; bonding the second substrate portion to the first substrate portion so as to define a bonding interface between the second and third oxide layers; performing a first annealing procedure to enhance oxide-to-oxide bonding between the second and third oxide layers; performing a second annealing procedure at a higher temperature than the first annealing procedure so as to create a front of connecting voids corresponding to a location of the hydrogen species; separating the bonded structure along the void front; and removing any remaining part of the first bulk silicon substrate and the SiGe layer on the silicon layer so as to define the DBBG SOI wafer structure, wherein the first oxide layer and the etch stop layer comprise an upper BOX, the bonded second and third oxide layers together comprise a lower BOX, the silicon layer comprises a silicon-on-insulator (SOI) layer, the back gate layer is disposed between the upper BOX and the lower BOX, and the second bulk silicon substrate comprises a bulk substrate of the DBBG SOI wafer structure.

In still another embodiment, a semiconductor substrate structure for integrated circuit devices includes a bulk substrate; a first insulating layer formed on the bulk silicon substrate, the first insulating layer corresponding to a lower insulating layer; an electrically conductive back gate layer formed on the lower insulating layer; a second insulating layer formed on the back gate layer, the second insulating layer comprising an etch stop layer having a dielectric constant greater than 4.0; a third insulating layer formed on the etch stop layer, with the second and third insulating layers, in combination, corresponding to an upper insulating layer; and a semiconductor-on-insulator layer formed on the upper insulating layer.

In still another embodiment, a method of implementing dual-depth shallow trench isolation (STI) formation in a semiconductor wafer includes forming a hardmask layer over a double buried insulator back gate semiconductor-on-insulator substrate, the double buried insulator back gate semiconductor-on-insulator substrate comprising a bulk substrate, a lower insulating layer formed on the bulk substrate, an electrically conductive back gate layer formed over the lower insulating layer, an upper insulating layer formed over the back gate layer, and a semiconductor-on-insulator layer formed on the upper insulating layer; patterning the hardmask layer and etching through the semiconductor-on-insulator layer so as to form shallow active area level STI recesses; forming a photoresist layer over the substrate and lithographically patterning the photoresist layer to selectively expose part of one or more of the active area level STI recesses; etching through any remaining portion of the upper insulating layer and the back gate layer, thereby forming one or more deep back gate level STI recesses having portions thereof self-aligned to portions of one or more of the shallow active area level recesses; and filling both the shallow active area STI recesses and the self-aligned deep back gate level STI recesses with one or more insulating materials, and thereafter planarizing the one or more filled insulating materials.

In still another embodiment, a semiconductor substrate structure with self-aligned, dual-depth shallow trench isolation (STI) for integrated circuit devices includes a double buried insulator back gate semiconductor-on-insulator substrate, the double buried insulator back gate semiconductor-on-insulator substrate comprising a bulk substrate, a lower insulating layer formed on the bulk substrate, an electrically conductive back gate layer formed over the lower insulating layer, an upper insulating layer formed over the back gate layer, and a semiconductor-on-insulator layer formed on the upper insulating layer; a plurality of shallow active area level STI recesses formed through the semiconductor-on-insulator layer; one or more deep back gate level STI recesses formed through the upper insulating layer and the back gate layer, the one or more deep back gate level STI recesses having portions thereof self-aligned to portions of one or more of the shallow active area level recesses; and both the shallow active area STI recesses and the one or more self-aligned deep back gate level STI recesses filled with one or more insulating materials.

BRIEF DESCRIPTION OF THE DRAWINGS

Referring to the exemplary drawings wherein like elements are numbered alike in the several Figures:

FIGS. 1 and 2 illustrate the formation of a first substrate portion used for the DBBG SOI structure;

FIG. 3 illustrates a hydrogen species implanted into the silicon germanium (SiGe) layer of the first substrate portion;

FIG. 4 illustrates the formation of a second substrate portion used for the DBBG SOI structure;

FIG. 5 illustrates the bonding of the first substrate portion to the second substrate portion;

FIG. 6 illustrates an annealing procedure to form a fracture front in the SiGe layer of the bonded structure;

FIG. 7 illustrates the removal of a top portion of the bonded structure following separation at the SiGe layer;

FIG. 8 illustrates the remaining bottom portion of the bonded structure and remaining SiGe layer following wafer separation;

FIG. 9 illustrates the completed DBBG SOI wafer structure following removal of the remaining SiGe layer and final bonding annealing procedure.

DETAILED DESCRIPTION

Disclosed herein is a method of fabricating low cost DBBG SOI wafers by eliminating the use of more expensive, preformed SOI wafers as a starting substrate. In brief, the embodiments utilize partially processed bulk silicon wafers that are bonded at one location and then subsequently separated at another location to form a double BOX structure, and with the least need for highly uniform chemical mechanical polishing (CMP) in the substrate fabrication. It should be understood that although terms such as "BOX" and "SOI"

originate from specific acronyms in the art that define certain materials (e.g., oxide, silicon), such terms may also be applied to other materials such as insulators and semiconductors in general. That is, SOI can also describe other semiconductors besides silicon on insulators, and BOX can refer to other buried insulator materials besides oxides.

Figure 1:
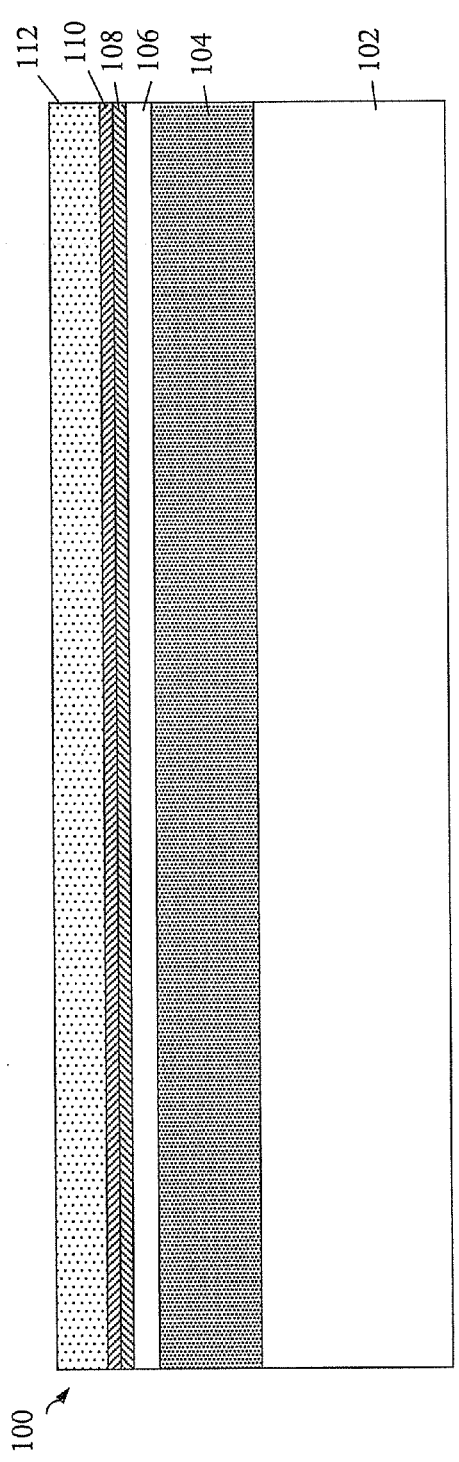
FIGS. 1-9 are various cross-sectional views illustrating a method of forming a double buried oxide (BOX), back gate (DBBG) silicon-on-insulator (SOI) wafer structure, in accordance with an embodiment of the invention, where in particular.

FIG. 1 illustrates the formation of a first substrate portion 100, in which a bulk silicon substrate 102 has a sacrificial silicon germanium (SiGe) layer 104 (e.g., 5-1000 nanometers (nm) in thickness) deposited thereon, at an exemplary Ge concentration of about 10-35%. The SiGe is followed by a thin layer 106 (e.g., about 5-50 nm) of epitaxially grown silicon that will ultimately serve as the SOI layer of the double BOX structure. The silicon layer 106 may be formed in the same processing step as the SiGe layer (e.g., by shutting off a Ge gas source after completion of the SiGe layer formation). Then, a relatively thin (e.g., about 5-20 nm) oxide layer 108 is thermally grown or deposited on top of the silicon layer 106. The oxide layer 108 may be thermally grown or deposited at a temperature of about 600-800° C., for example.

As further shown in FIG. 1, an etch stop layer 110 is deposited at a thickness of about 5-10 nm on the oxide layer 108. The etch stop layer 110 is an insulator which may be a high dielectric constant (high-K) material such as, for example, SiN, $HfO_2$, $HfSiO_2$, $Al_2O_3$, etc. As used herein, a "high-K" material may refer to any material having a dielectric constant substantially greater than 4.0. Then, an electrically conductive layer 112 of back gate material (e.g., amorphous silicon, doped or undoped polysilicon, metal, metal silicide, metal nitride, etc.) of about 20-100 nm in thickness is deposited on the high-K etch stop layer 110.

Figure 2:
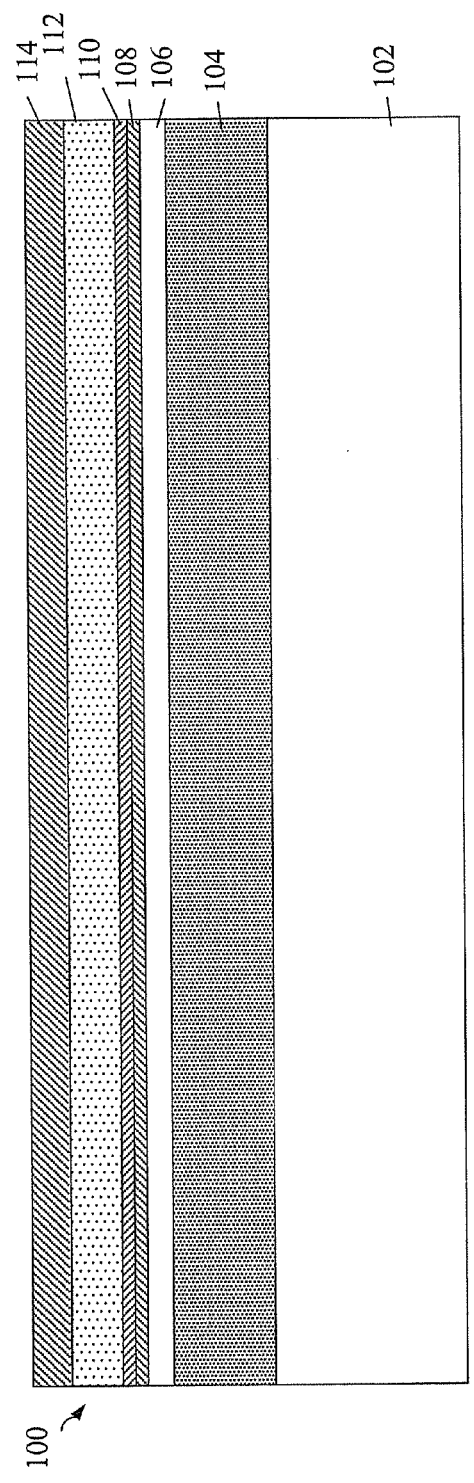
Figure 3:
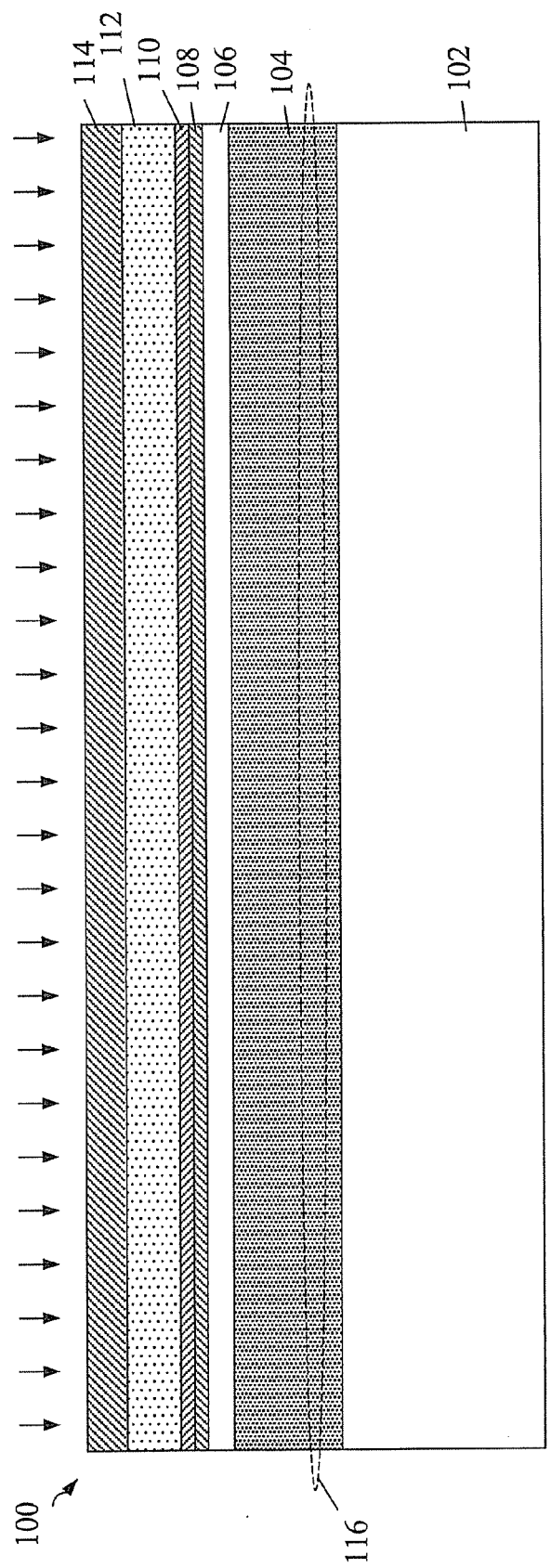

In FIG. 2, another oxide layer 114 (e.g., about 10-25 nm) is thermally grown or deposited on the back gate layer 112, which defines a subsequent oxide bonding interface. Then, as shown in FIG. 3, a hydrogen implant step is performed (as indicated by the arrows) in order to insert a layer of hydrogen species within or beyond the SiGe layer 104, in accordance with the well known Smart-Cut® process described in U.S. Pat. No. 5,374,564. In order to prevent damage to the silicon (SOI) layer 106, the hydrogen species implant conditions should be such that the species stops or peaks at a suitable location such as in the SiGe layer 104, as indicated by implant region 116 in FIG. 3.

Figure 4:
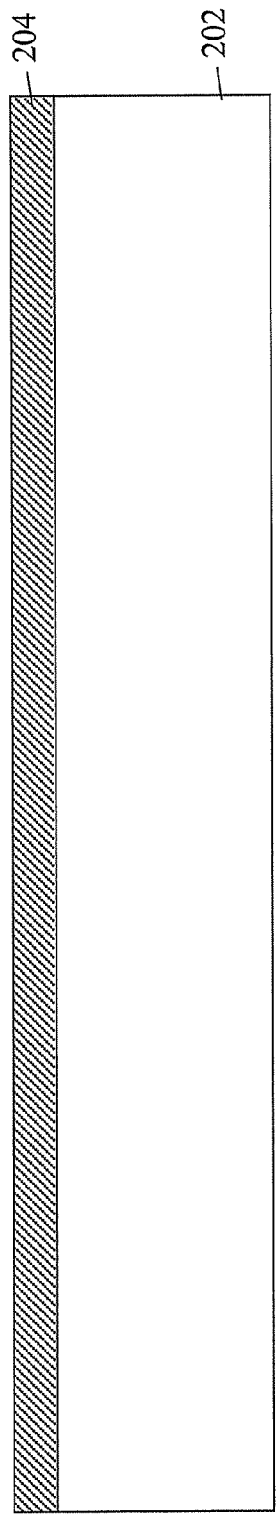
Figure 5:
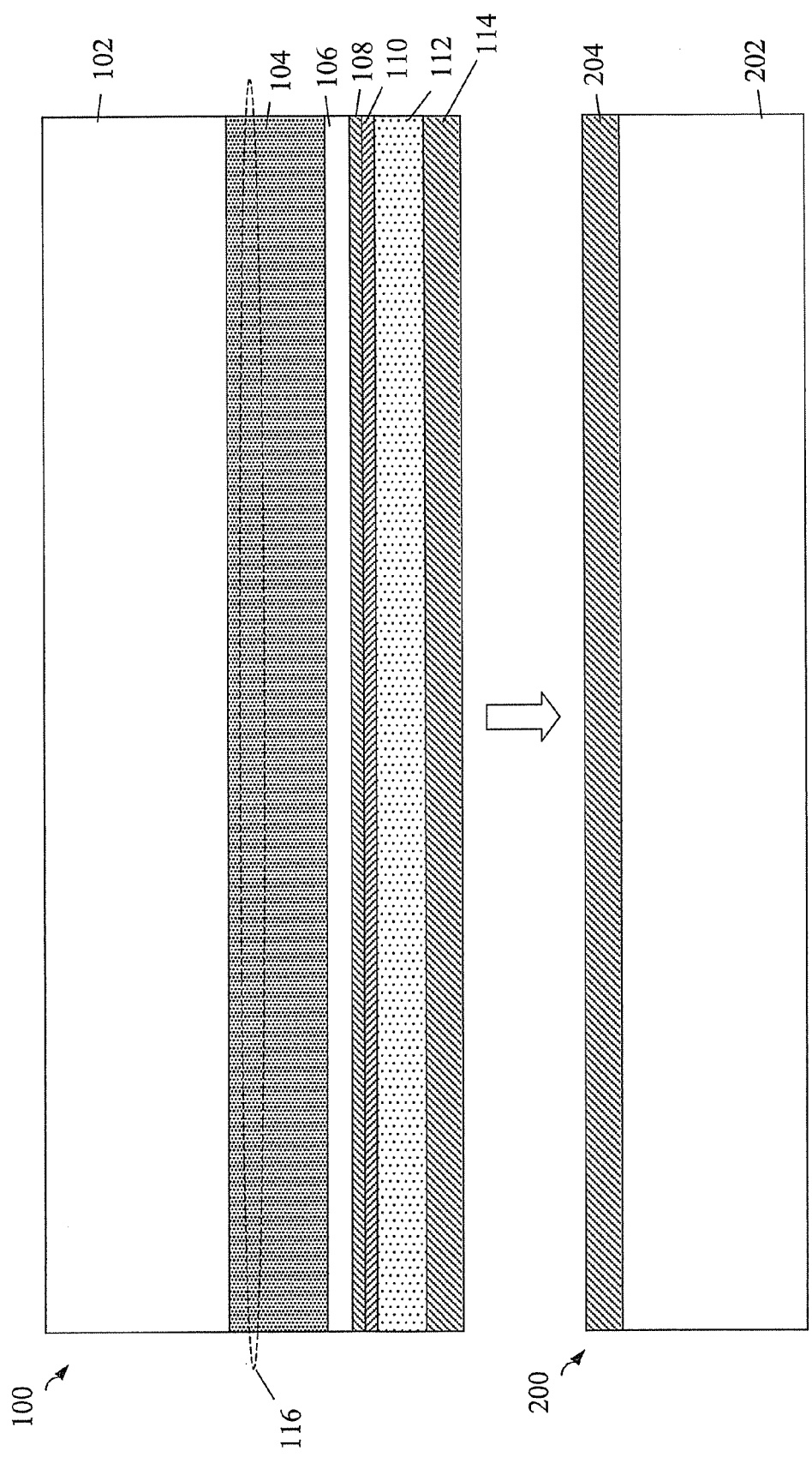

Referring next to FIG. 4, there is shown the formation of a second substrate portion 200, in which another bulk silicon substrate 202 has an oxide layer 204 (e.g., 10-100 nanometers (nm) in thickness) thermally grown or deposited thereon. FIG. 5 illustrates the bonding of the first substrate portion 100 to the second substrate portion 200, wherein the deposited oxide layer 114 of the first substrate portion 100 is bonded to the oxide layer 204 of the second substrate portion 200 through oxide-to-oxide bonding. Thus bonded, layers 114 and 204 combine to define a lower BOX layer for a double BOX substrate. A first annealing procedure (e.g., at about 300° C.) is performed in order to enhance the bonding interface between layers 114 and 204.

Figure 6:
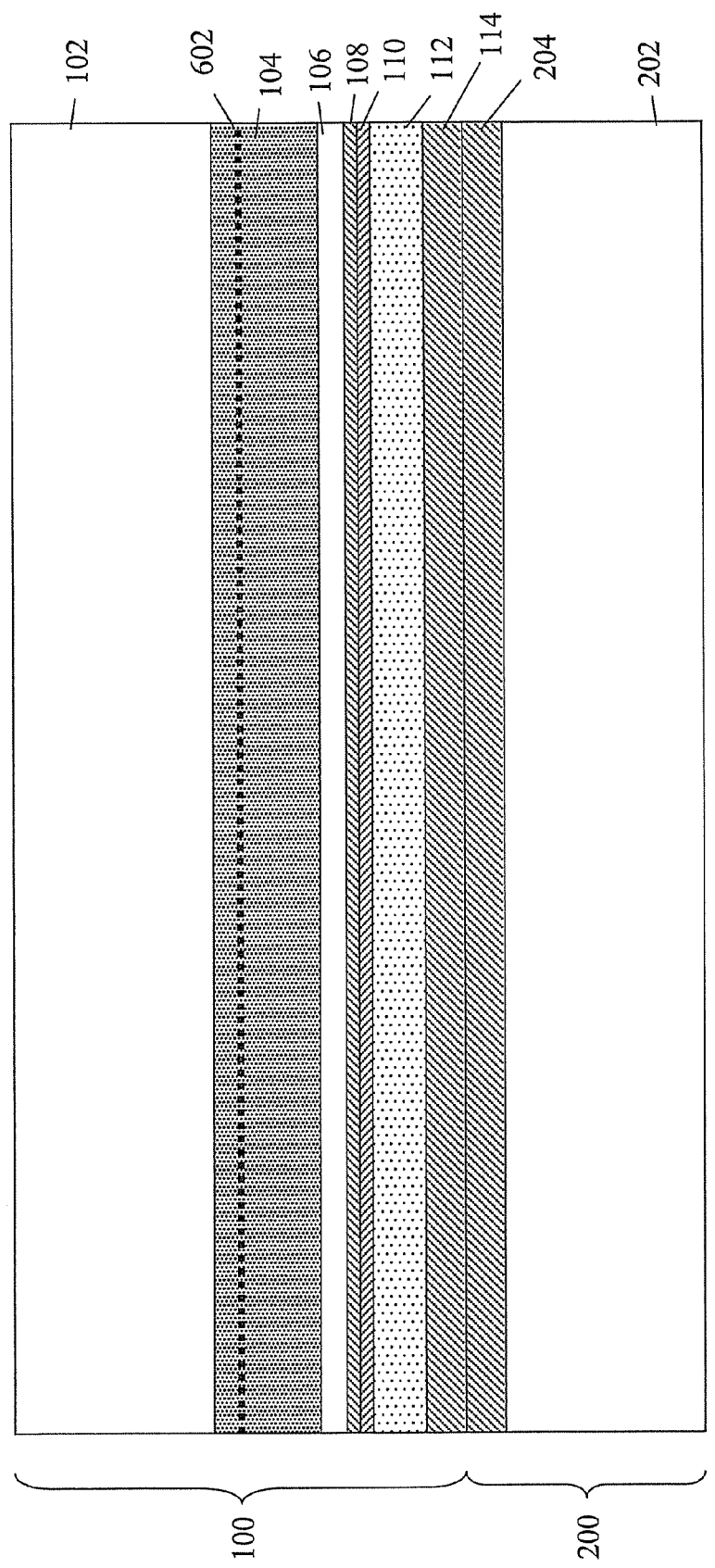
Figure 7:
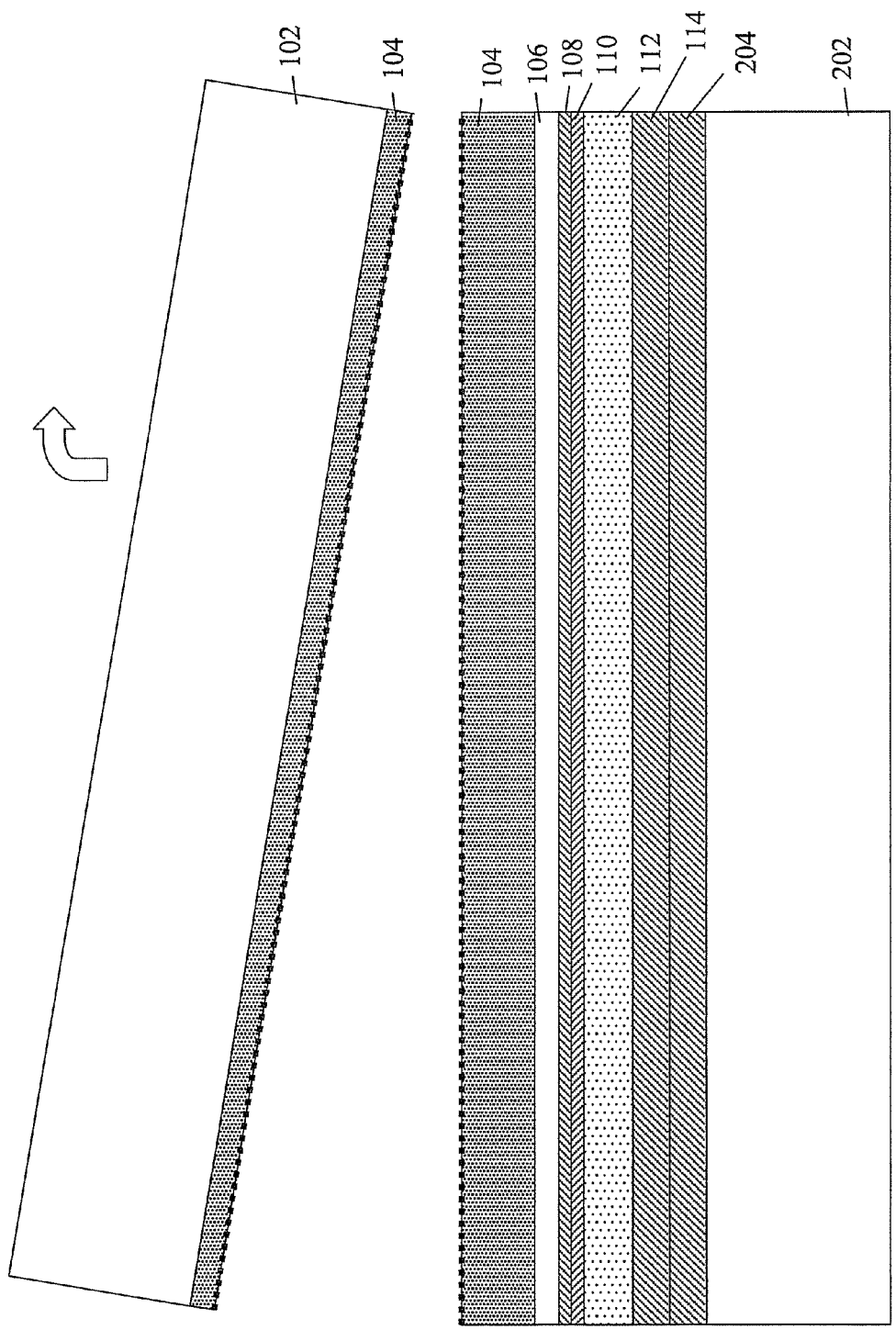
Figure 8:
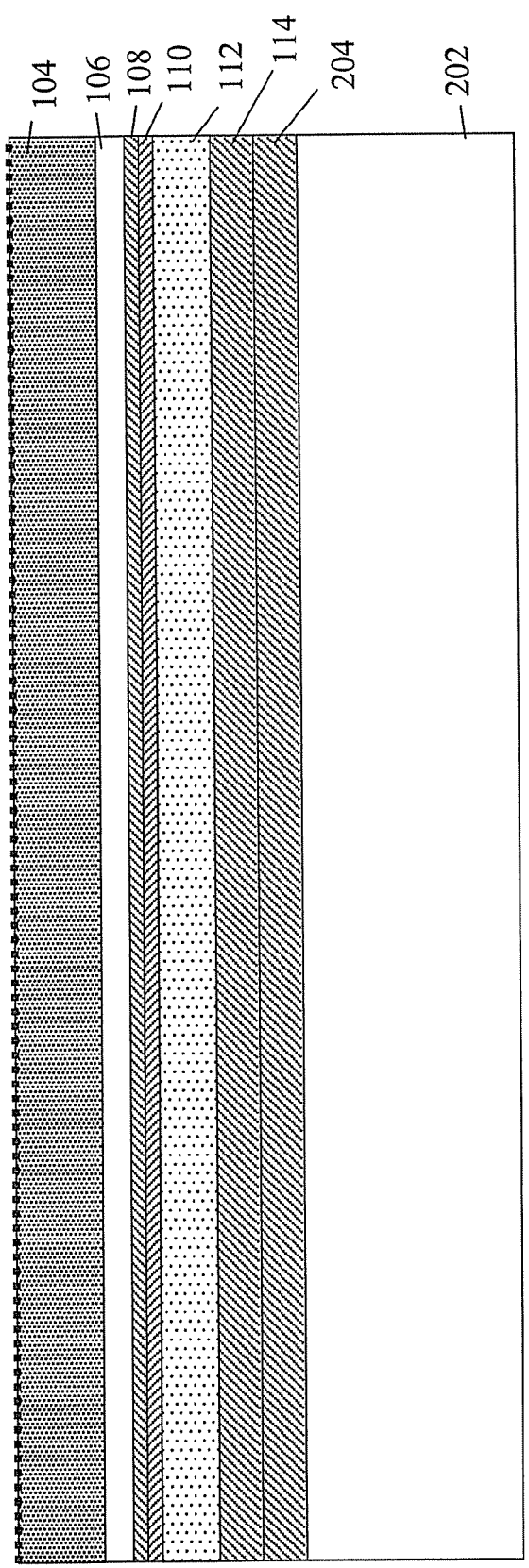

As then shown in FIG. 6, the structure undergoes a second annealing procedure (at a higher temperature than the first annealing procedure, e.g., at about 400° C.) so as to cause the hydrogen species to form a front of connecting voids 602 of hydride regions within the SiGe layer 104. The structure is then fractured along the front as shown in FIG. 7. The top portion including bulk substrate 102 and a portion of SiGe layer 104 is then removed, leaving the structure as shown in FIG. 8 in which a portion of the SiGe layer 104 remains following wafer separation. Again, it will be appreciated that in the event the implant region 116 is substantially defined beyond the SiGe layer 104 and into the bulk silicon substrate 102 during the implant procedure of FIG. 3, then the separation along the front in FIG. 7 would be depicted within bulk silicon substrate 102, and a portion thereof would remain atop the structure shown in FIG. 8.

Figure 9:
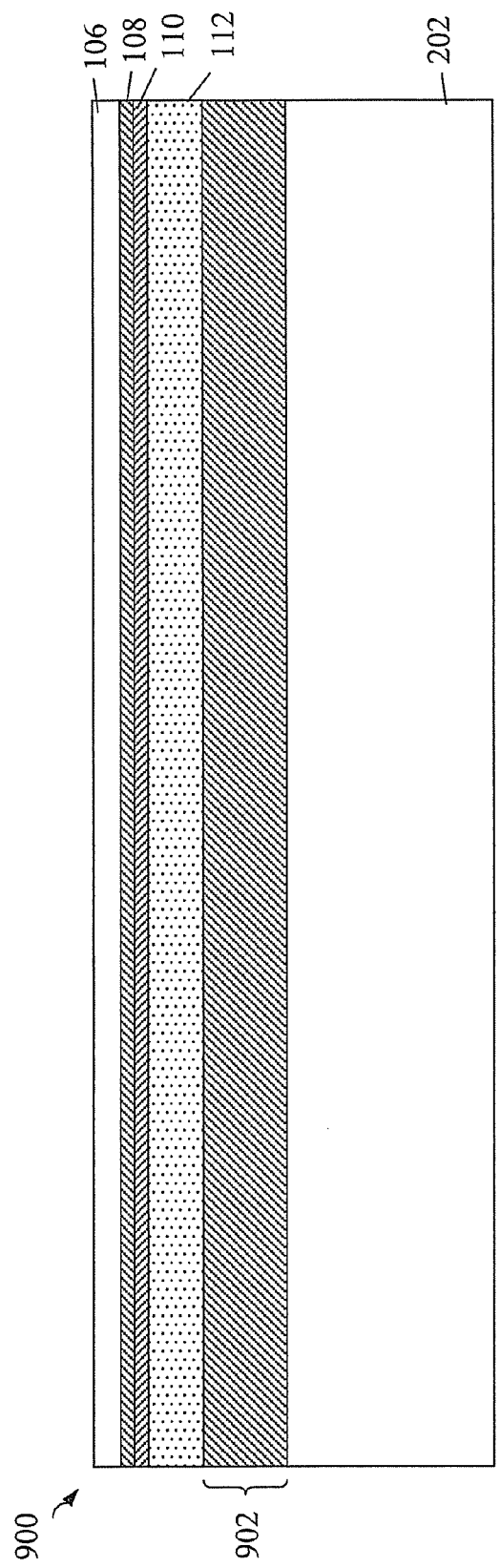

Next, any remaining portion of the first silicon substrate 102 is removed, for example, by polishing or by a selective wet etch with respect to silicon (e.g., a tetramethylammonium hydroxide (TMAH) etch), and the remaining SiGe layer 104 is removed using an etch selective with respect to SiGe such as a hot Huang A type solution ($NH_4OH:H_2O_2:H_2O$). Finally, another annealing procedure (at a higher temperature than the second annealing procedure, e.g., at about 800-1000° C.) is then performed to further enhance the oxide-to-oxide bonding. As shown in FIG. 9, this results in a double BOX back gate structure 900 having a bulk substrate 202, a lower BOX layer 902 (having the oxide bonding interface therein) over the substrate 202, a conductive back gate layer 112 over the lower BOX layer 902, an etch stop layer 110 over the conductive back gate layer 112, an upper BOX layer 108 over the high-K etch stop layer 110 and an SOI layer 106 over the upper BOX layer 108. Moreover, the DBBG SOI structure 900 is formed in a manner such that an expensive SOI starting substrate is not used beforehand, and in a manner where the thickness of the remaining SOI layer 106 and the dielectric layers 108 and 110 are all well controlled. The etch stop layer 110 over the conductive back gate layer 112 provides a wet and dry etch isolation from a subsequent dual-depth shallow trench isolation (STI) fabrication process for both the back gate and the active regions, and serves as a current leakage barrier for subsequent device operations.

Figure 10:
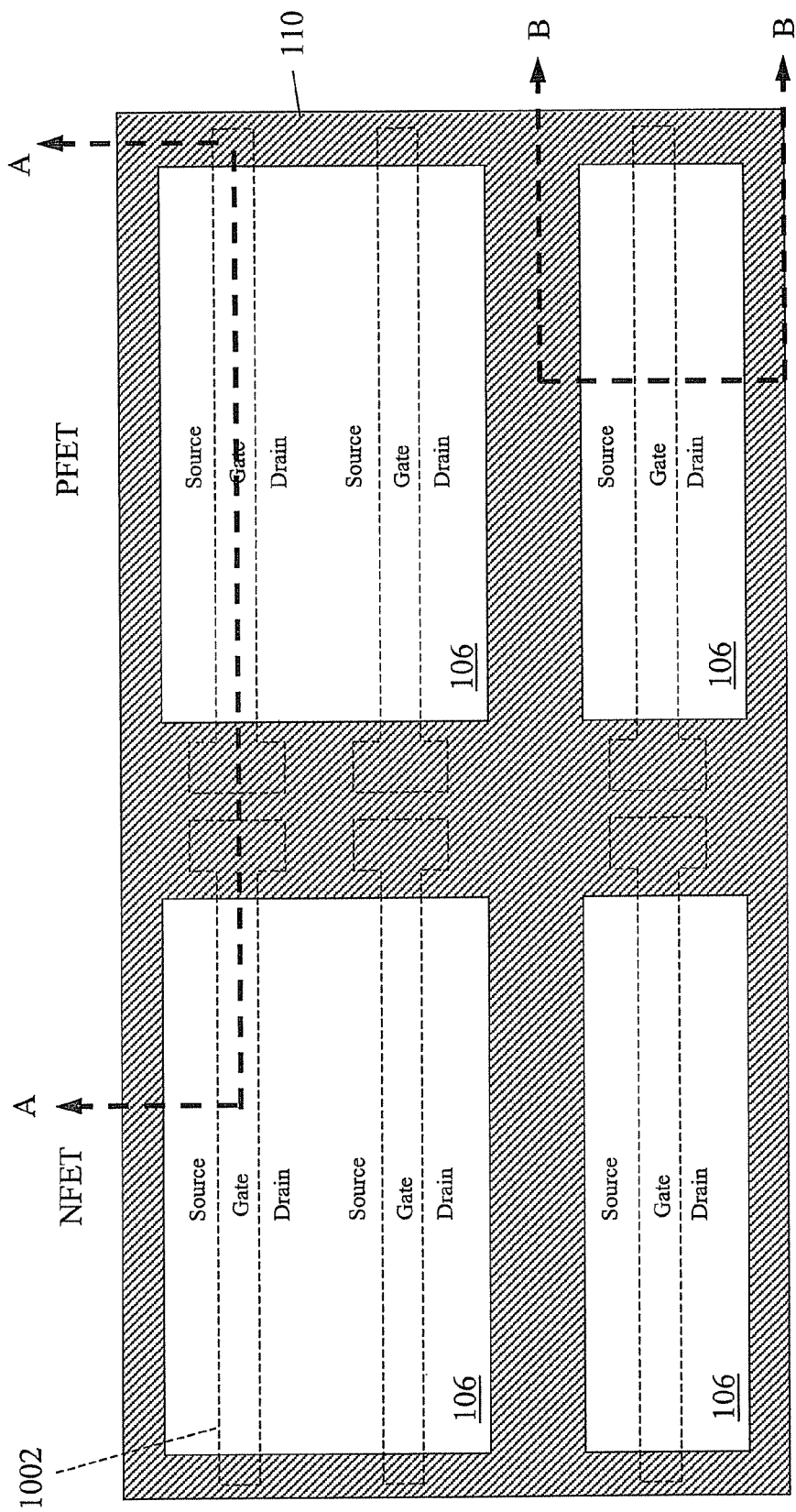
FIGS. 10-18 are various top and cross sectional views illustrating a subsequent self-aligned dual-depth shallow trench isolation process for the DBBG SOI wafer structure prior to front gate formation, in accordance with a further embodiment of the invention.

The DBBG SOI structure 900 as shown in FIG. 9 can be used in a subsequent dual-depth, self-aligned STI formation process in which, for example, transistor areas may be defined and dielectrically isolated by shallow STI regions within the SOI layer, and functional dielectrically-isolated back gates for individual transistors or groups of transistors may be defined by deeper STI regions passing through the back gate layer. Referring now to FIG. 10, there is shown a top view of a DBBG SOI structure, following patterning of a hardmask layer (not shown in FIG. 10) and etching of the SOI layer 106 and upper BOX layer 108 (not seen in FIG. 10), stopping on the high-K etch stop layer 110 so as to form active area mesas 106. Also shown in FIG. 10 and depicted by dashed regions 1002 are the relative locations of subsequently formed front gate structures (i.e., above the active area of the SOI layer 106), as well as the location of source/drain diffusion region subsequently implanted within the active area to define transistor devices.

Figure 11A:
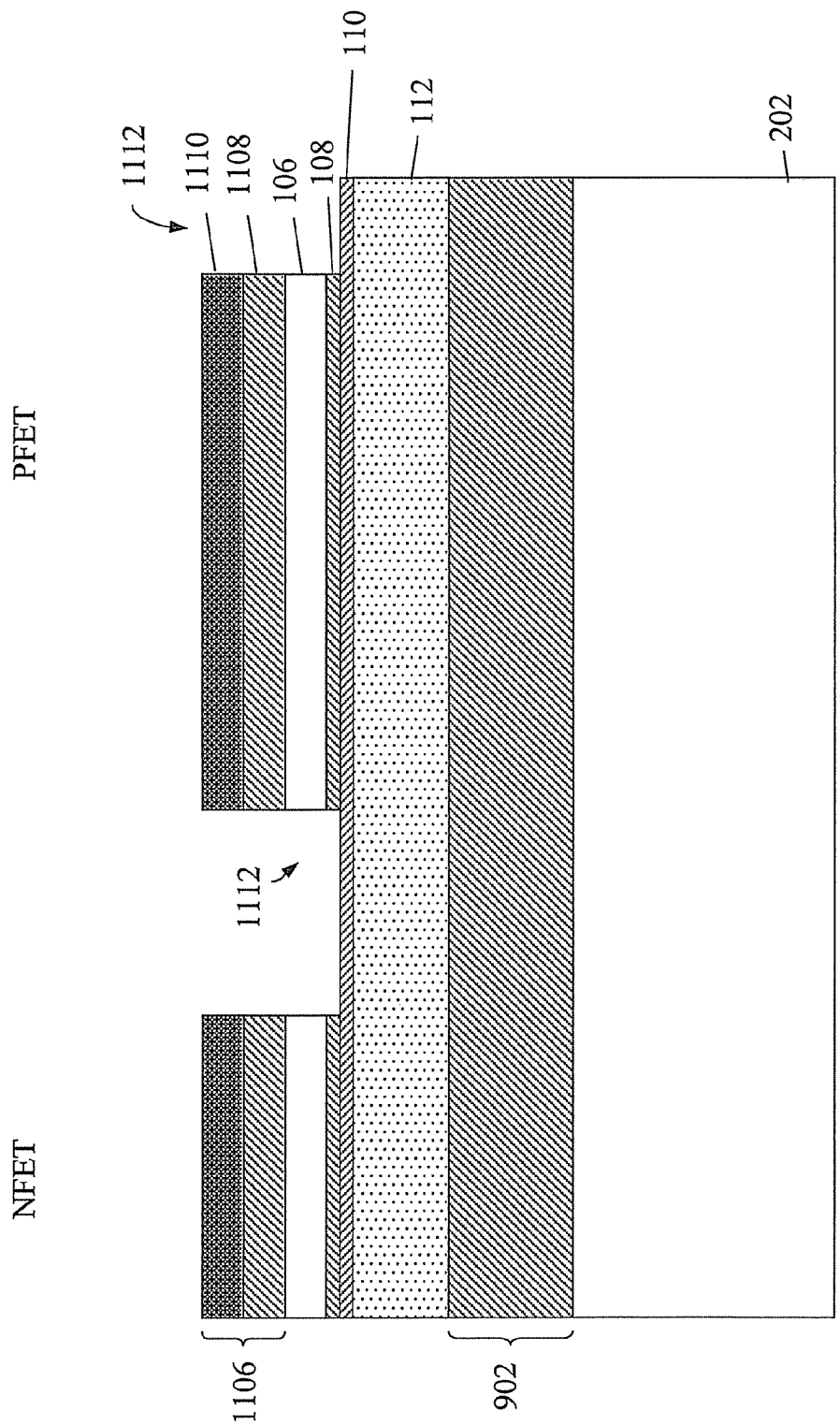
Figure 11B:
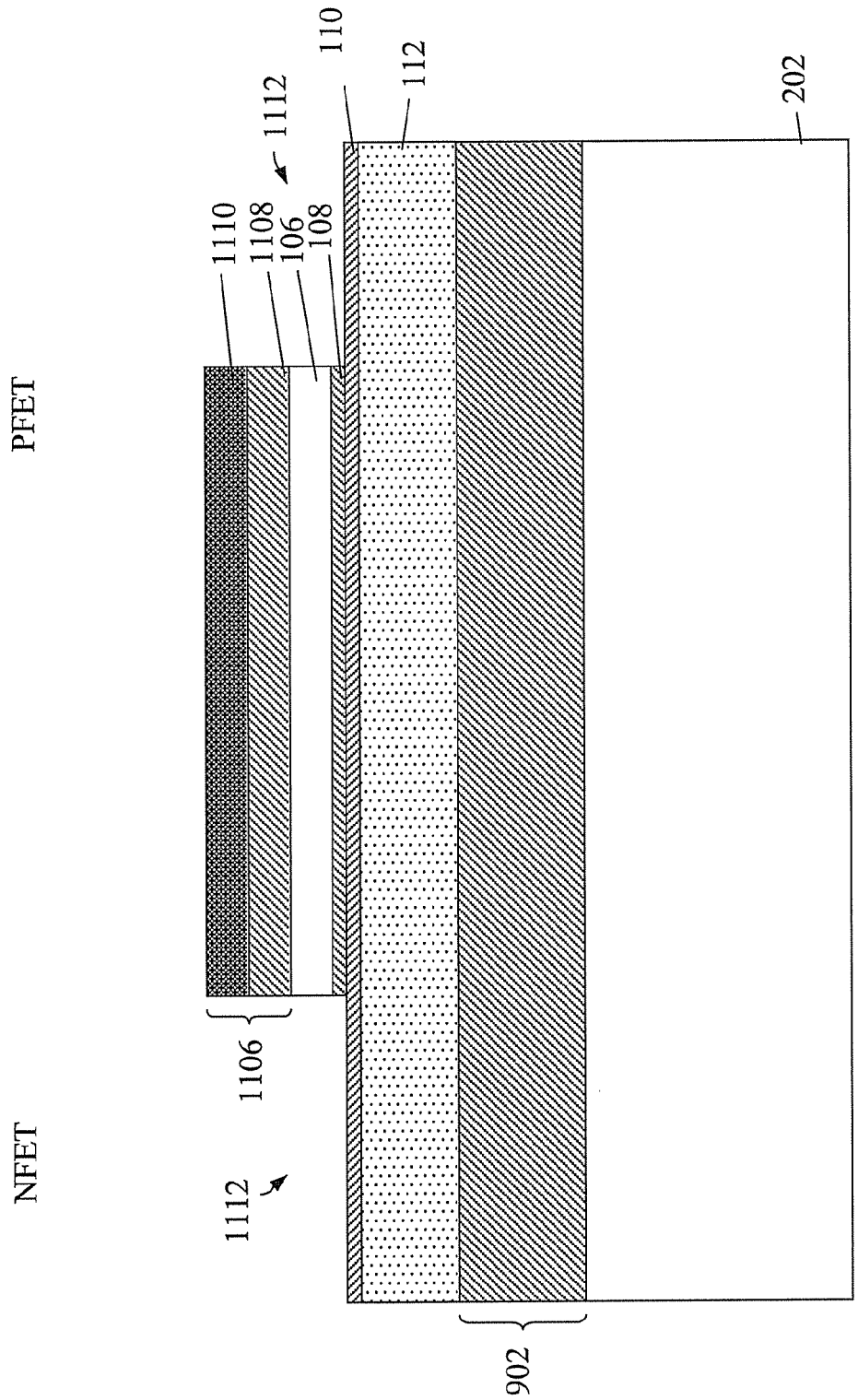

FIG. 11(a) is a cross sectional view of the structure taken along the arrows A-A in FIG. 10, while FIG. 11(b) is a cross sectional view of the structure taken along the arrows B-B in FIG. 10. It will first be noted that in addition to the substrate layers shown and described in conjunction with FIGS. 1-9, the backgate layer 112 can be surrounded by a lower layer of silicon nitride (SiN) and an upper layer of SiN 110 to act as a dopant diffusion barrier, in the event that polysilicon is the selected material of choice for the back gate layer 112. In this embodiment, such SiN layers (e.g., about 5-10 nm in thickness) would be formed immediately before and after the formation of back gate layer in FIG. 1. As also shown in FIG. 11(a), an active area hardmask 1106 may include, for example, an SiN layer 1110 and a high density plasma (HDP) deposited oxide layer 1108.

In both FIGS. 11(a) and 11(b), the isolation between adjacent active areas in the SOI layer 106 is depicted as shallow STI recesses 1112 for transistor device isolation. Portions of one or more of the STI recesses 1112 at this level will also define lower and deeper STI recesses at the back gate level, which in turn will be self-aligned to the corresponding shallower STI recesses at the SOI level.

Figure 12:
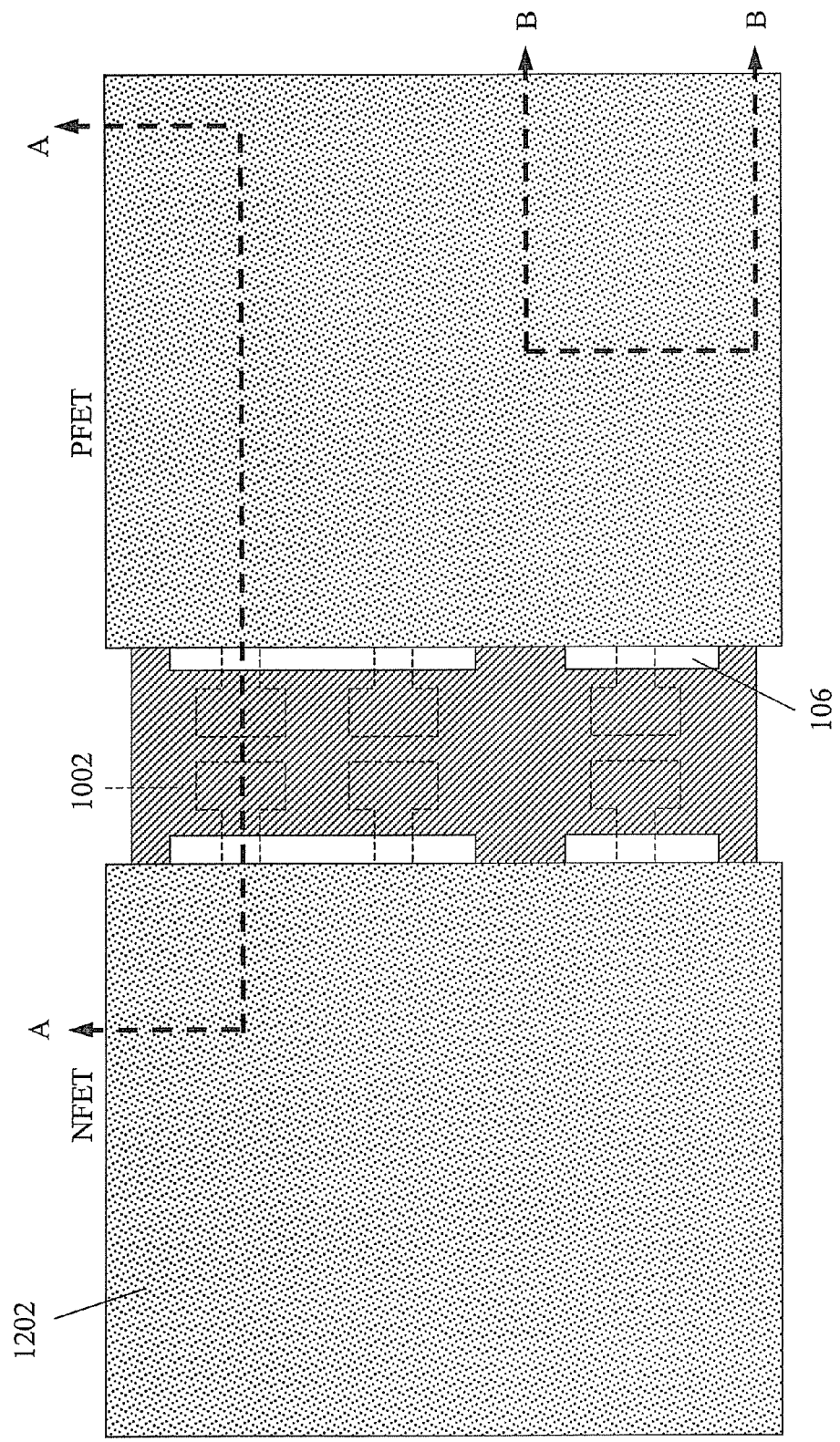
Figure 13A:
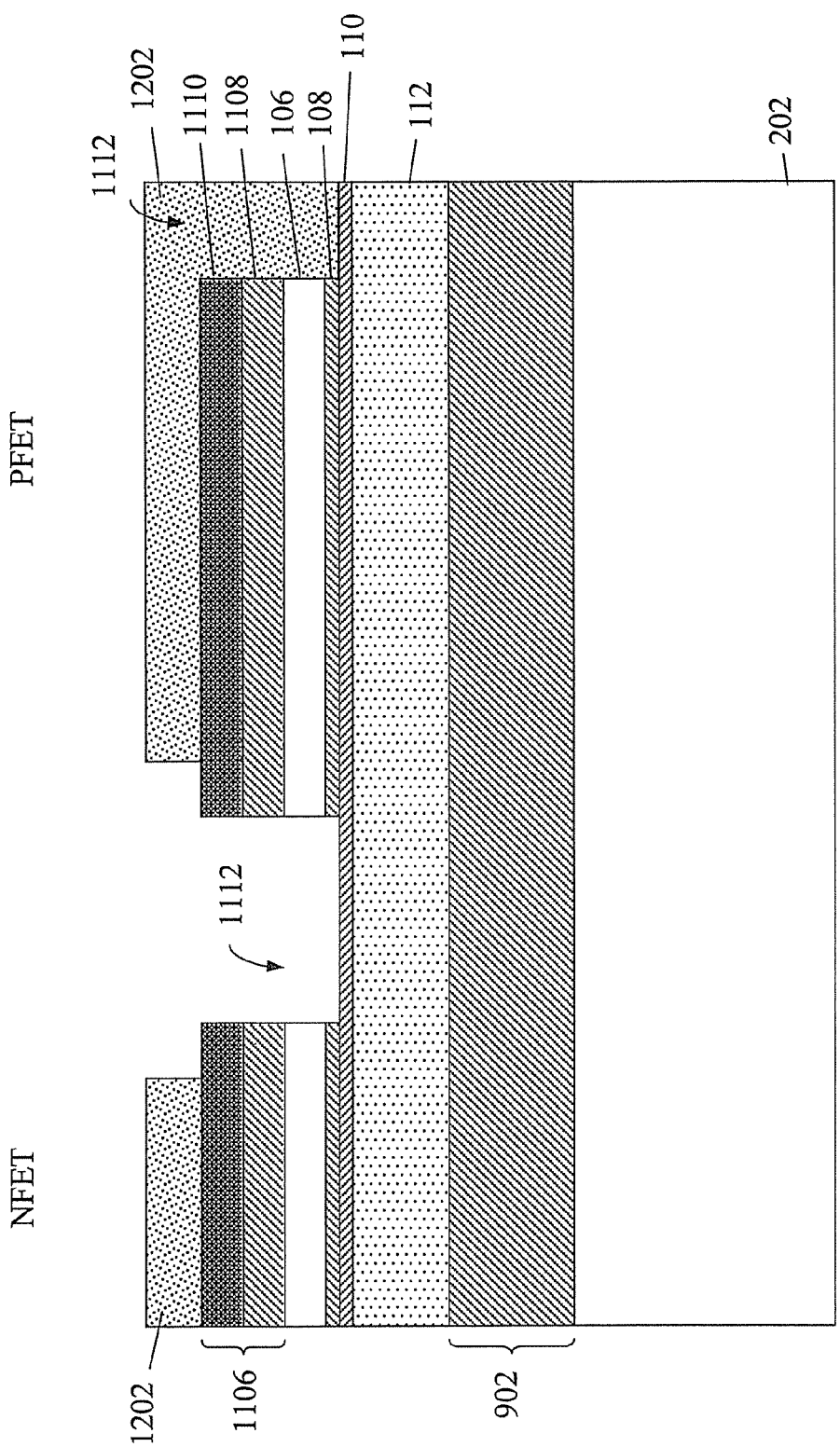
Figure 13B:
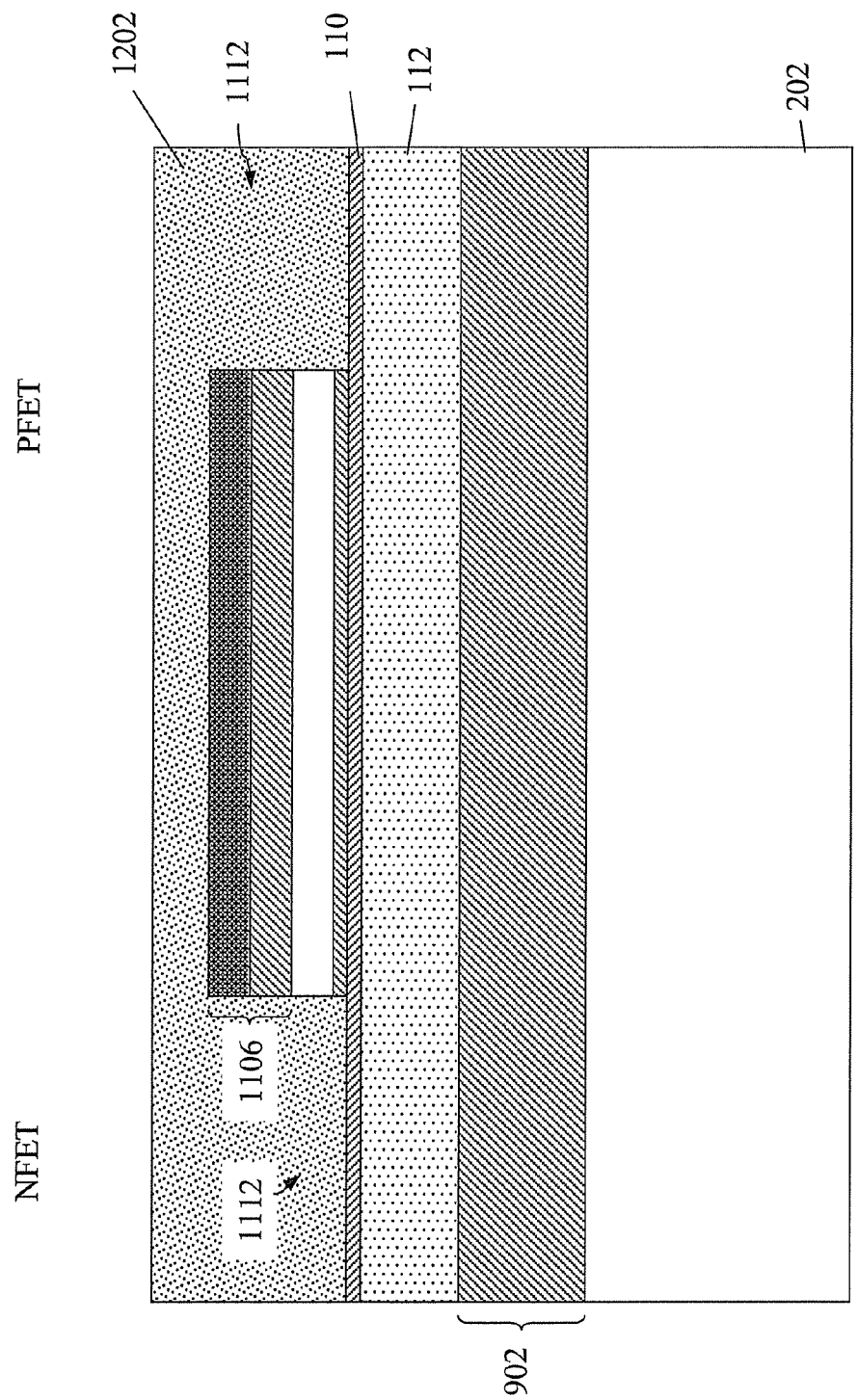

In the top view of FIG. 12, a photoresist layer 1202 is used to cover the active areas of the device, followed by exposure and selective removal of the resist to expose a portion of one or more of the STI recesses 1112 where the deeper back gate level STI recesses are to be formed. FIG. 13(*a*) is a cross sectional view taken along the arrows A-A in FIG. 12, while FIG. 13(*b*) is a cross sectional view taken along the arrows B-B in FIG. 12.

Figure 14:
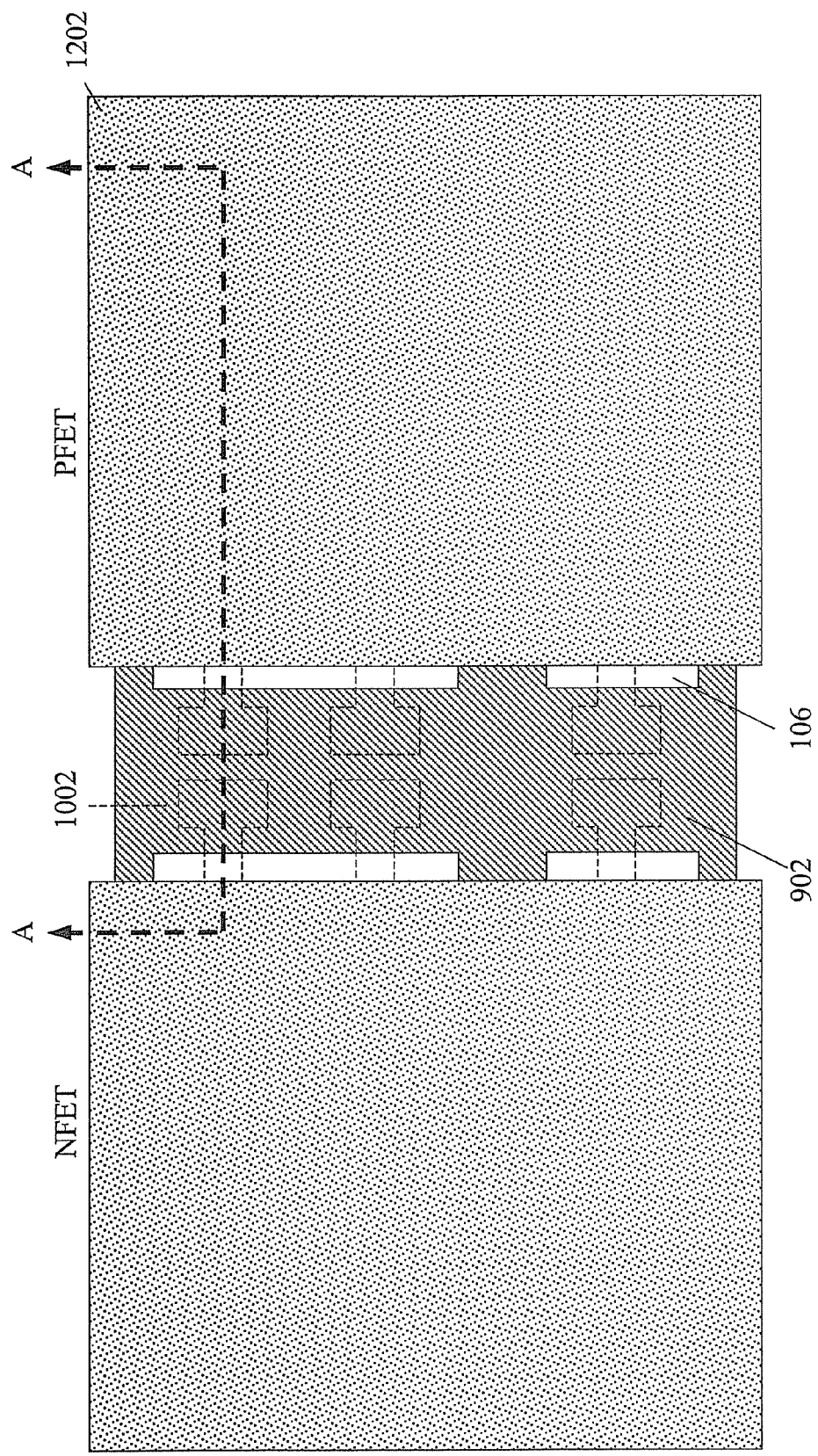
Figure 15:
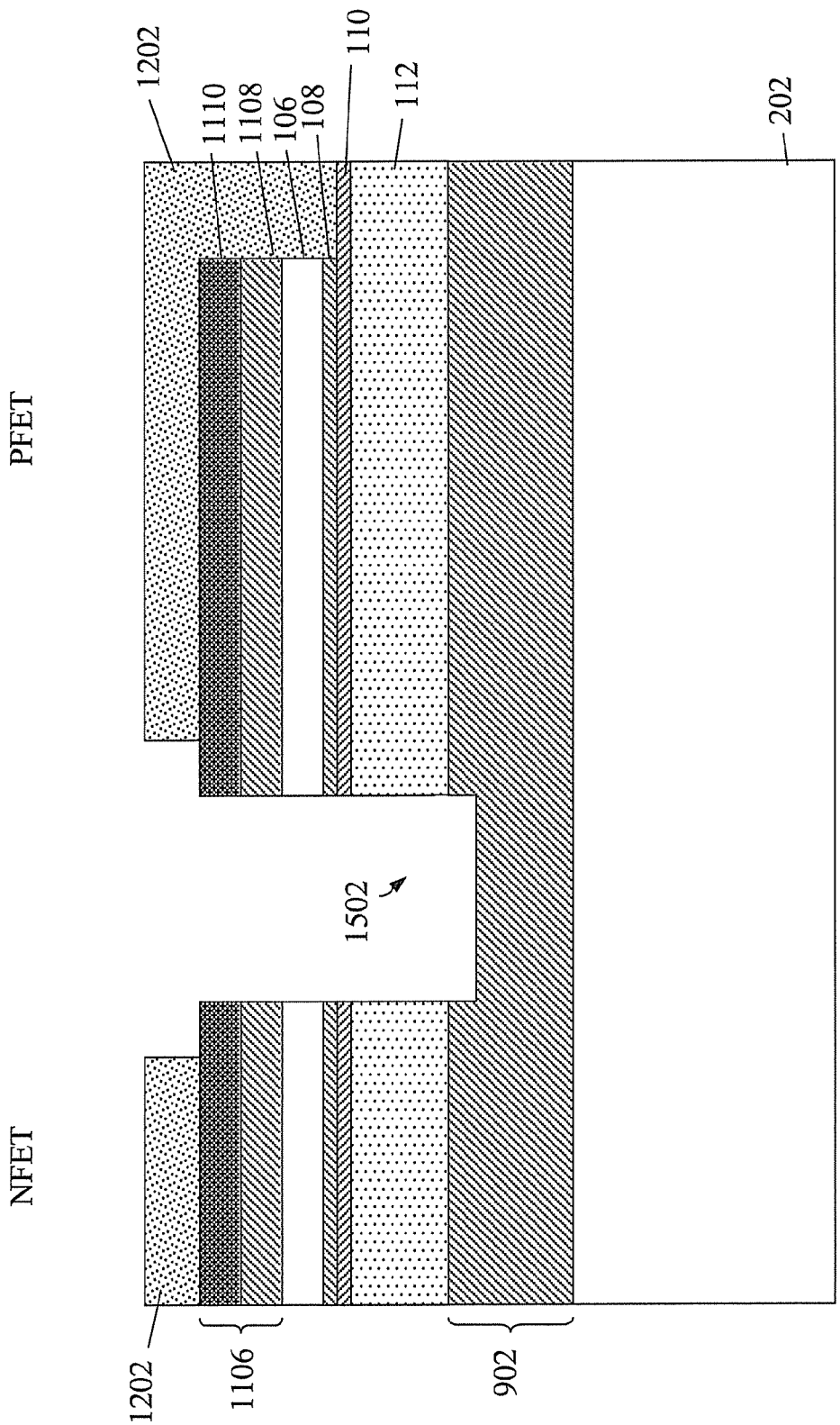

The deeper back gate level STI recess(es) are defined by etching, beginning with the etch stop layer 110 (using a separate etch chemistry with respect to the SOI level shallower STI etching), through the back gate layer 112 (again changing etch chemistry), and stopping on or in the lower BOX 902. A top view following the deeper back gate STI etch is shown in FIG. 14. FIG. 15 is a cross sectional view taken along the arrows A-A in FIG. 14. In particular, FIG. 15 illustrates a deeper recess 1502 for a back gate level STI.

Figure 16:
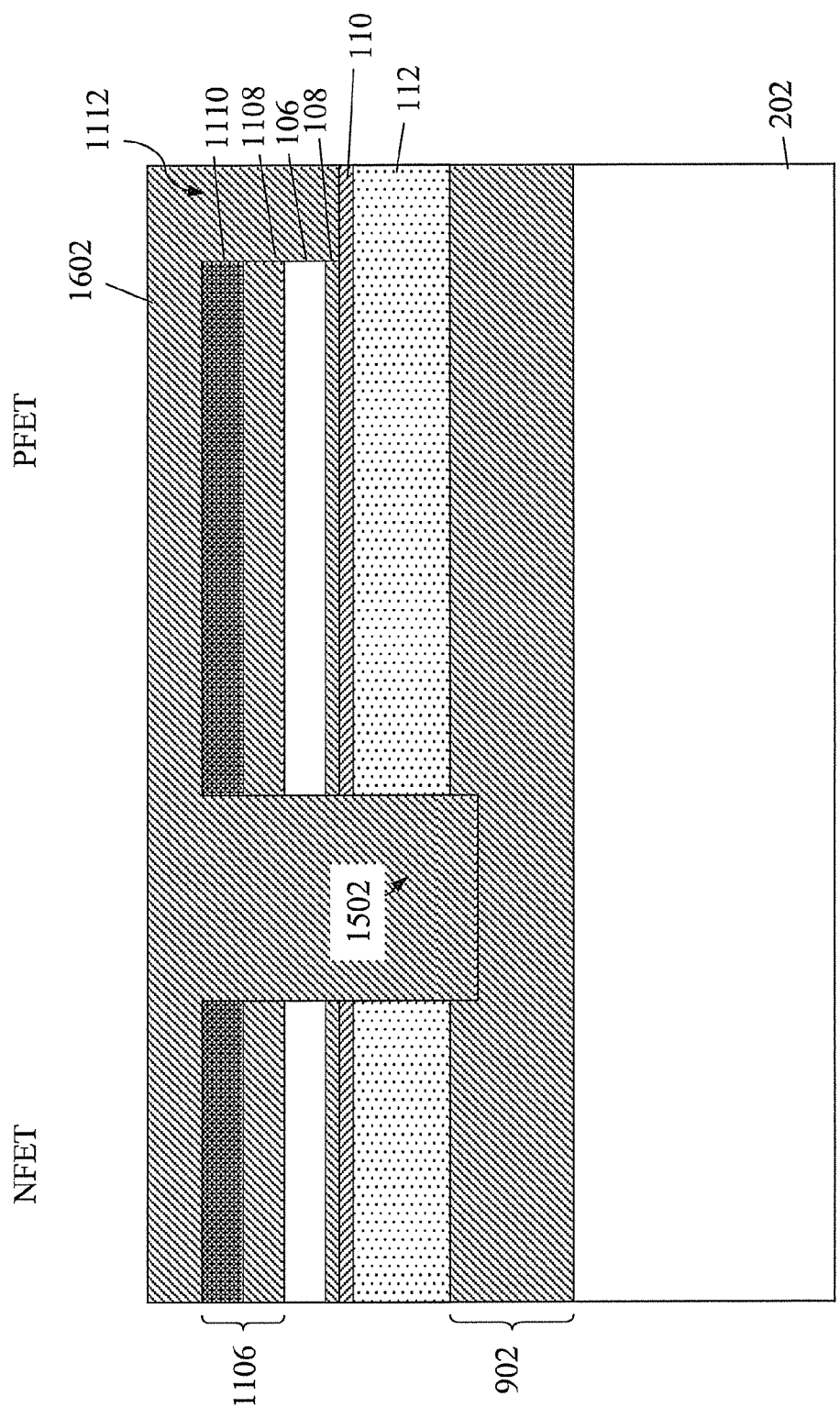
Figure 17:
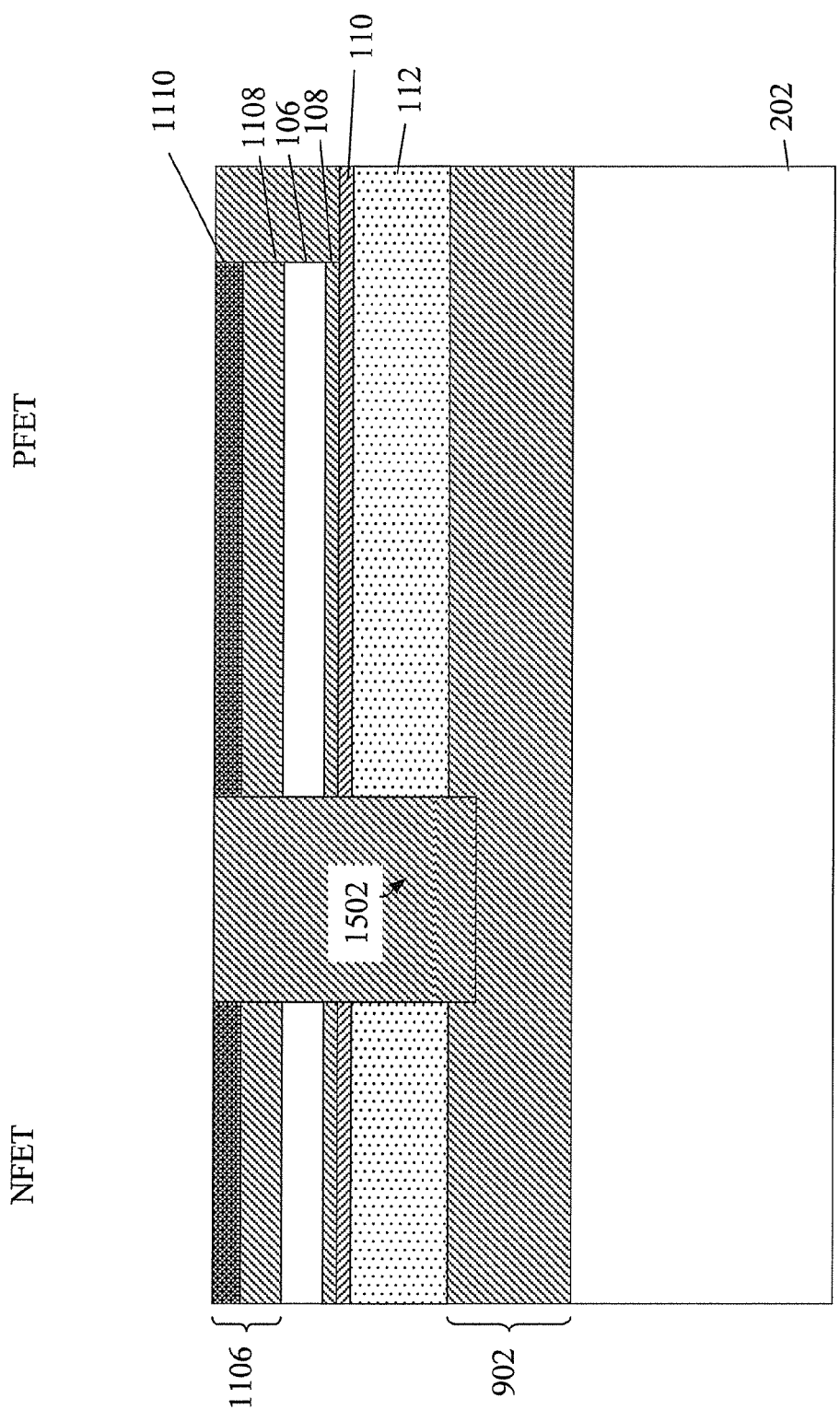

Both the shallower (1112) and the deeper (1502) STI recesses are filled with deposition of dielectric material(s) such as HDP oxide. Additional layers of other insulating materials can be included in the STI fill as well. FIG. 16 shows the structure in FIG. 15 after the STI fill process. The wafer is then treated with a high-temperature annealing procedure (e.g., at 1000° C.) to render densification of the deposited STI fill materials 1602 that are to be processed for the subsequent chemical and mechanical polish (CMP). The deposited STI fill materials 1602 are thinned down by the chemical and mechanical polish (CMP) process and polished into the SiN layer 1110 by a certain depth (e.g., 10-15 nm). FIG. 17 shows both the shallower and the deeper STI structures after the CMP process.

Figure 18:
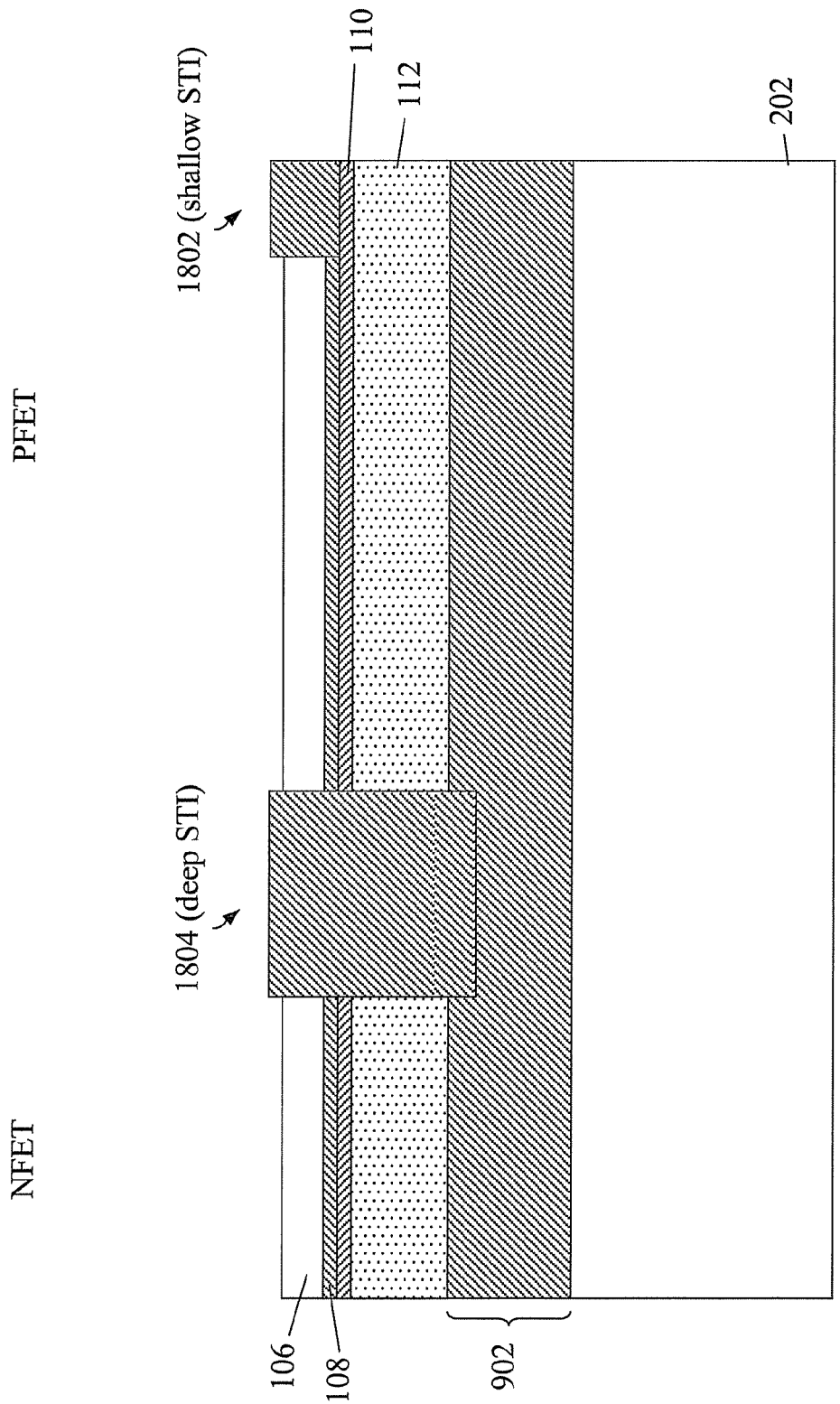

In FIG. 18, the active area hardmask 1106 is removed by chemical etching (using different chemicals to remove the SiN layer 1110 and the HDP oxide layer 1108). In particular, FIG. 18 shows that the shallower STI 1802 and the deeper STI 1804, formed by the self-aligned process, facilitate dielectric isolations between the FETs and between the back gate areas for NFET and PFET.

While the invention has been described with reference to a preferred embodiment or embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A method of implementing dual-depth shallow trench isolation (STI) formation in a semiconductor wafer, the method comprising:
    forming a hardmask layer over a double buried insulator back gate semiconductor-on-insulator substrate, the double buried insulator back gate semiconductor-on-insulator substrate comprising a bulk substrate, a lower insulating layer formed on the bulk substrate, a lower layer of silicon nitride formed on the lower insulting layer, a polysilicon back gate layer formed on the lower layer of silicon nitride, an upper insulating layer formed on the polysilicon back gate layer, the upper insulating layer comprising an etch stop layer formed directly on the polysilicon back gate layer and an oxide layer formed on the etch stop layer, and a semiconductor-on-insulator layer formed on the upper insulating layer; wherein the lower layer of silicon nitride and etch stop layer act as a dopant diffusion barrier for the polysilicon back gate layer;
    patterning the hardmask layer and etching through the semiconductor-on-insulator layer so as to form shallow active area level STI recesses, wherein etching of the shallow active area level STI recesses stops on the etch stop layer;
    forming a photoresist layer over the substrate and lithographically patterning the photoresist layer to selectively expose part of one or more of the shallow active area level STI recesses;
    etching through any remaining portion of the upper insulating layer and the back gate layer, thereby forming one or more deep back gate level STI recesses having portions thereof self-aligned to portions of one or more of the shallow active area level STI recesses by converting the portions of one or more of the shallow active area level STI recesses to the deep back gate level STI recesses, wherein etching of the deep back gate level STI recess stops within the lower insulating layer; and
    simultaneously filling both the shallow active area level STI recesses and the self-aligned deep back gate level STI recesses with one or more insulating materials, and thereafter planarizing the one or more filled insulating materials such that top surfaces of the insulating materials in filled shallow active area level STI recesses are substantially coplanar with top surfaces of the insulating materials in filled deep back gate level STI recesses.

2. The method of claim 1, wherein the lower insulating layer has an oxide-to-oxide bonding interface therein.

3. The method of claim 1, wherein the lower layer of silicon nitride and etch stop layer have a thickness of about 5-10 nanometers (nm).

4. A semiconductor substrate structure with self-aligned, dual-depth shallow trench isolation (STI) for integrated circuit devices, comprising:
    a double buried insulator back gate semiconductor-on-insulator substrate, the double buried insulator back gate semiconductor-on-insulator substrate comprising a bulk substrate, a lower insulating layer formed on the bulk substrate, a lower layer of silicon nitride formed on the lower insulting layer, a polysilicon back gate layer formed on the lower layer of silicon nitride, an upper insulating layer formed on the polysilicon back gate layer, the upper insulating layer comprising an etch stop layer formed directly on the polysilicon back gate layer and an oxide layer formed on the etch stop layer, and a semiconductor-on-insulator layer formed on the upper insulating layer; wherein the lower layer of silicon nitride and etch stop layer act as a dopant diffusion barrier for the polysilicon back gate layer;
    a plurality of shallow active area level STI recesses formed through the semiconductor-on-insulator layer, wherein a bottom surface of the shallow active area level STI recesses stops on the etch stop layer;
    one or more deep back gate level STI recesses formed through the upper insulating layer and the back gate layer, the one or more deep back gate level STI recesses having portions thereof self-aligned to portions of one or more of the shallow active area level STI recesses, wherein a bottom surface of the one or more deep back gate level STI recesses stops within the lower insulating layer; and both the shallow active area level STI recesses and the one or more self-aligned deep back gate level STI recesses filled with one or more insulating materials, wherein top surfaces of the insulating materials in filled shallow active area level STI recesses are substantially coplanar with top surfaces of the insulating materials in filled deep back gate level STI recesses.

5. The structure of claim 4, wherein the lower insulating layer has an oxide-to-oxide bonding interface therein.

6. The structure of claim 4, wherein the lower layer of silicon nitride and etch stop layer have a thickness of about 5-10 nanometers (nm).

* * * * *